United States Patent [19]
Baker et al.

[11] Patent Number: 5,979,043
[45] Date of Patent: Nov. 9, 1999

[54] METHOD OF MANUFACTURING A CIRCUIT ASSEMBLY FROM TWO OR MORE LAYERS OF FLEXIBLE FILM

[75] Inventors: Jay DeAvis Baker, Dearborn; Robert Edward Belke, Jr., W. Bloomfield; Daniel Phillip Dailey, West Bloomfield; Andrew Z. Glovatsky, Livonia; Richard Keith McMillan, II, Dearborn, all of Mich.

[73] Assignee: Ford Motor Company, Dearborn, Mich.

[21] Appl. No.: 08/892,463

[22] Filed: Jul. 14, 1997

[51] Int. Cl.⁶ ........................................................ H05K 3/36
[52] U.S. Cl. ................................ 29/830; 29/831; 29/841; 29/848; 156/245; 264/258
[58] Field of Search .............................. 29/830, 831, 840, 29/841, 848, 852; 156/87, 90, 245, 289; 264/257, 258, 263; 427/97

[56] References Cited

U.S. PATENT DOCUMENTS

| 5,118,458 | 6/1992 | Nishihara et al. . |
| 5,220,488 | 6/1993 | Denes . |
| 5,461,202 | 10/1995 | Sera et al. . |

FOREIGN PATENT DOCUMENTS

| 0488121 | 6/1992 | European Pat. Off. . |
| 2264167 | 8/1993 | United Kingdom . |
| 2268700 | 1/1994 | United Kingdom . |

*Primary Examiner*—Lee Young
*Assistant Examiner*—Kevin G. Vereene
*Attorney, Agent, or Firm*—Damian Porcari

[57] ABSTRACT

A method of manufacturing an electronic circuit assembly that includes a number of electrically interconnected flexible films, each flexible film having a flexible electrical wiring circuit. The electrical wiring circuits are interconnected between film layers and the film layers are adhered to a molded backing structure. A first flexible film is formed with a pattern of flexible electrical wiring circuits created on at least one surface thereof. The first flexible film has a passage that provides an electrical connection through the flexible film. A second flexible film is formed with a pattern of flexible electrical wiring circuits created on a least one surface thereof. The second flexible film has an electrical interconnect feature that connects with the electrical passage on the first film and electrically connects the first film with the second film. The first flexible film is overlaid juxtaposed the second flexible film so that the passage is aligned adjacent the electrical interconnect feature. The first and second flexible films are placed within an open mold. The mold is closed and a plastic material is injected within the mold adjacent at least one surface of the first and second flexible films. The molten plastic adheres to the first and second flexible films and forms an integral backing structure. The backing structure and first and second flexible films together form the circuit assembly.

14 Claims, 6 Drawing Sheets

METHOD OF MANUFACTURING A CIRCUIT ASSEMBLY FROM TWO OR MORE LAYERS OF FLEXIBLE FILM

BACKGROUND OF THE INVENTION

1. Field of the Invention

The present invention relates to a method of manufacturing an electronic circuit assembly from two or more flexible films. More specifically, the present invention relates to a method of simultaneously connecting two or more flexible films and integrally molding a rigid backing on the flexible films by injection molding and the article produced by this method.

2. Description of the Related Arts

It is known to manufacturing circuit assemblies from flexible films having flexible electronic circuits printed or traced thereon. An example of commercially available films produced by this construction is illustrated in U.S. Pat. No. 5,461,202. Flexible films enable the production of electronic circuit boards into highly contoured, three-dimensional shapes. They also allow the electrical circuits to be manufactured separately from the backing structure. This enables the use of different materials for the backing structure and film. One way that flexible films are used is through a process called film capture or in-molding. In-molding refers to the process where a flexible film of either metal, polymer or a combination of both is inserted into a mold and subsequently molded into a circuit assembly. The film becomes adhered to the backing structure by either mechanical interlocking, adhesives or an interdiffusion of the resin and polymer film. These films typically contain electrical wiring features or circuits to create a functional electronic module when fully assembled with electronic components.

One example of an electronic circuit made from an in-molding process is illustrated in U.S. Pat. No. 5,118,458 ('458). This reference teaches a method of producing a multi-layer circuit assembly by sequentially building up layers of flexible films. A first flexible film has a circuit traced thereon and a hot-melt adhesive is placed on the reverse side. The film is then placed within a molding tool and a resin is injected against the facing side of the film. The mold is heated to cure the circuit traces. Additional film layers are sequentially added. Through-holes are formed through the layers of film and the through-holes filled with a conductive paste. Electronic circuits are then attached to the layers of flexible film. The '458 reference requires a number of steps and complicated tooling to form the multi-layer circuit assembly. Each layer is separately built-up. Additionally, the layers are only interconnected at one point when the through-holes are made in the built-up film. This reduces the flexibility of interconnecting the separate film layers at multiple locations and the possibility of connecting only two film layers of a multi-layer stack.

It is also known to manufacture electronic circuit assemblies by forming a backing only along a portion of a flexible film as shown in U.S. Pat. No. 5,220,488 ('488). The '488 patent teaches placing an elongated film into a mold tool where only a portion of film receives an injection molding backing. The '488 device does not teach the use of multi-layer films to create a complex circuit design. While the films and backing produced by the '488 device can be folded into compact shapes, three-dimensional backings are not taught.

SUMMARY OF THE INVENTION

Electronic circuit assemblies made from a single layer of flexible film do not provide the optimum packing density for electronics and result in a physically larger part. It is desirable to reduce the physical size and weight of electronic devices by placing the electronic components in as close proximity to one another as possible. The use of multi-layer circuits is employed to reduce the area of the electronic device. A multi-layer circuit refers to the stacking of many single or two layer planar films of circuitry that interconnect through plated or un-plated through holes or blind pad interconnects. This is what is referred to as a planar or two-dimensional, multi-layer circuit board that requires the use of costly materials and numerous fabrication steps.

The present invention makes use of in-molding to create a three-dimensional, multi-layer circuit assembly having an integral backing structure. This three-dimensional circuit assembly provides an optimum packaging density geometry and uses low cost materials. It also eliminates many circuit board fabrication steps. The invention allows for the creation of interconnect passages between the flexible film layers during the in-molding process. Solder, electrically conductive adhesives or other media can be used to interconnect the different layers during or after the molding step. The molding step injects plastic behind the layers to form a backing structure. The result is a three-dimensional multi-layer circuit assembly consisting of a backing structure made from polymeric materials such as PET, nylon or Ultem™ with conductors and interconnection features integrally incorporated by means of in-molded flexible circuit films. The films may be made from materials that are either compatible with one another and with the backing structure or from dissimilar materials. Compatible materials tend to blend within each other when heated and inter-diffuse. Dissimilar materials neither inter-diffuse nor readily bond to each other. Adhesives or adhesion promoters are needed to secure dissimilar materials.

It is desirable to provide a method of manufacturing an electronic circuit assembly that includes a number of electrically interconnected flexible films, each flexible film having an electrical wiring circuit. The electrical wiring circuits are interconnected between film layers and the film layers are adhered to a molded backing structure. The invention provides a method of constructing an electronic circuit of this construction by means of the following steps. A first flexible film is formed with a pattern of electrical wiring circuits created on at least one surface thereof. The first flexible film has an interconnect passage that provides an electrical connection through the flexible film. A second flexible film is formed with a pattern of electrical wiring circuits created on a least one surface thereof. The second flexible film has an interconnect feature designed to connect with the electrical passage on the first film and to electrically connect the first film with the second film in the finished article. The first and second flexible films are placed within an open mold such that the first flexible film is overlaid juxtaposed the second flexible film with the electrical passage aligned adjacent the electrical interconnect feature. The mold is closed and a plastic material is injected within the mold adjacent to at least one surface of the first or second flexible films. The molten plastic adheres to the second flexible film and forms an integral backing structure. The heat from the molding process and compatibility of materials causes the second film to bond with the first film. The backing structure and first and second flexible films together form the circuit assembly. After the plastic material has sufficiently cooled, the mold is opened and the circuit assembly removed.

The invention also includes methods for interconnecting the wiring circuit layers during or after the molding step.

Solder or a conductive adhesive may be applied to the electrical passage and to the electrical interconnect feature. The mold may optionally include heaters that cause the solder to melt and flow or cure the conductive adhesive during the molding process. Additionally, the resulting heat from the molten plastic may also be sufficient to either melt the solder or cure the adhesive.

Similarly, after the molding step, solder paste or conductive adhesive may be applied to the interconnect passages to electrically interconnect them. The molten plastic may be selected from a material that is compatible with the flexible film so that when it is injected into the mold, the molten plastic causes the flexible film to soften and fuse to the injected plastic material. Circuit assemblies of this construction appear as an integral unit. The discrete film layers blend into one uniform structure with the electrical circuits contained within the circuit assembly.

The invention may also be practiced by using an injected plastic that is made from a different or incompatible plastic material than the flexible film. Using this construction requires either a mechanical attachment between the film and plastic or the use of adhesives between the films or plastic material. The use of different or incompatible materials is useful where the properties of the backing structure and film are selected to achieve different results. For example, the flexible film may be selected from a material that provides a high melting point to withstand soldering while the backing material is selected from a low-cost and light weight plastic material that has a lower melting point.

It is also useful to manufacture circuit assemblies with passages through two or more flexible film layers. Where these layers are open to the mold, these passages may become plugged with plastic from the injection step. The present invention also provides a method for the creation of these passages by placing a laminate barrier film over the passage. The barrier film adheres to one of the flexible films and prevents molten plastic material from clogging the passage. Optionally, the barrier film may contain a conductive circuit or deposit of solder to assist in attaching electronic components to the finished circuit assembly. Through-passages are created through the first and second flexible films. The through-passages are aligned in the mold and the barrier film is positioned adjacent to the aligned through-passages. The molten plastic is injected into the mold a distance away from the aligned through-passages. The barrier film prevents molten plastic from entering the through-passages. Depending on the material of the barrier film, it may either be permanently secured to the circuit assembly or temporally placed over the aligned through-passages and later removed.

The methods of the present invention produce an electronic circuit assembly having two or more layers of flexible film with a first flexible film having electrical wiring circuits on at least one surface thereof. The first flexible film has an electrical passage that provides an electrical connection through the first flexible film. A second flexible film has electrical wiring circuits on at least one surface thereof and overlies the first flexible film. The second flexible film has an electrical interconnect feature that connects with the electrical passage on the first flexible film and electrically connects the first flexible film with the second film. A backing structure is integrally formed with and adhered to at least one surface of the first and second flexible films.

The present invention has advantages over the prior art because a complex multi-layer circuit assembly may be fabricated in a low-cost injection mold tool. The method allows various layers of the multi-layer circuit to be interconnected in different areas and to different layers thus allowing greater flexibility with the design of the electronic component. Finally, the present invention allows for the fabrication of a multi-layer circuit assembly in a single molding operation using readily available materials and equipment. It is particularly suited for high-volume, high-speed manufacturing.

Further objects and advantages of the present invention will become more apparent from the following description in reference to the attached drawings.

DETAILED DESCRIPTION OF THE PREFERRED EMBODIMENTS

The present invention is directed to the fabrication of a multi-layer structure created through film capture or in-molding. In-molding or capture in-molding refers to the process where a flexible film either metal, polymer or a combination of both is inserted into a mold tool and is subsequently molded into a circuit assembly. The flexible film is captured by the injected resin and becomes an integral member of the molded part. The film is attached to the part by inter-diffusion of the resin and polymer film, mechanical interlocking or through the use of adhesives between either the film or resin. Injected resin forms a backing structure to support the films and may also act as a housing or carrier for the electrical component. The flexible films are interconnected through electrical passages through the films. These electrical passages may also be used to attach electronic components to the finished circuit assembly.

Figure 1:
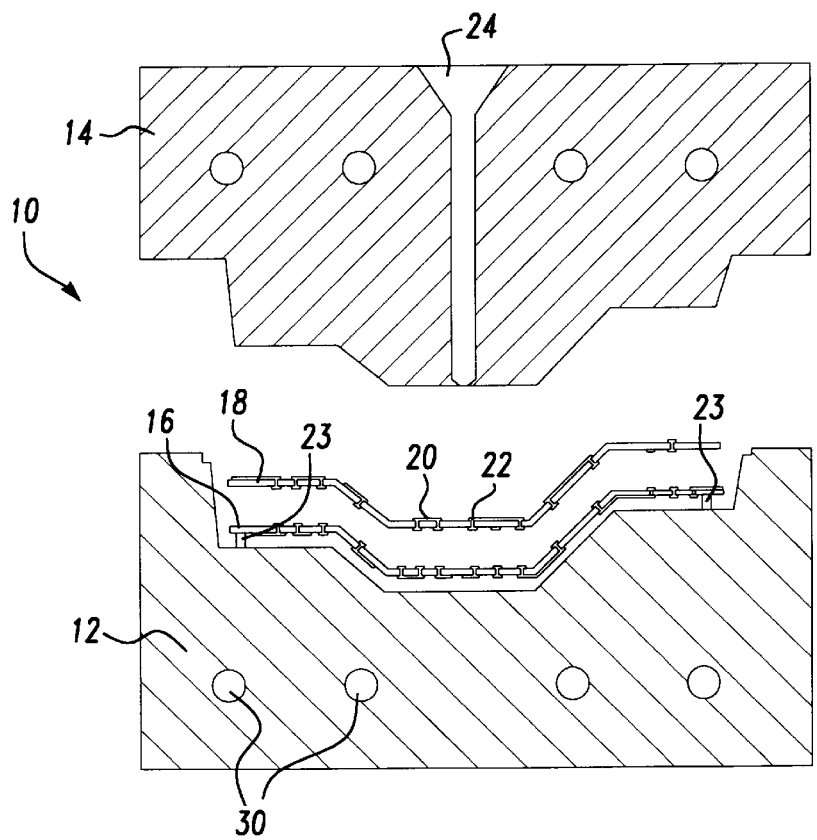
FIG. 1 is a cross-sectional view of a mold with two flexible films positioned between the open mold pieces.
Figure 2:
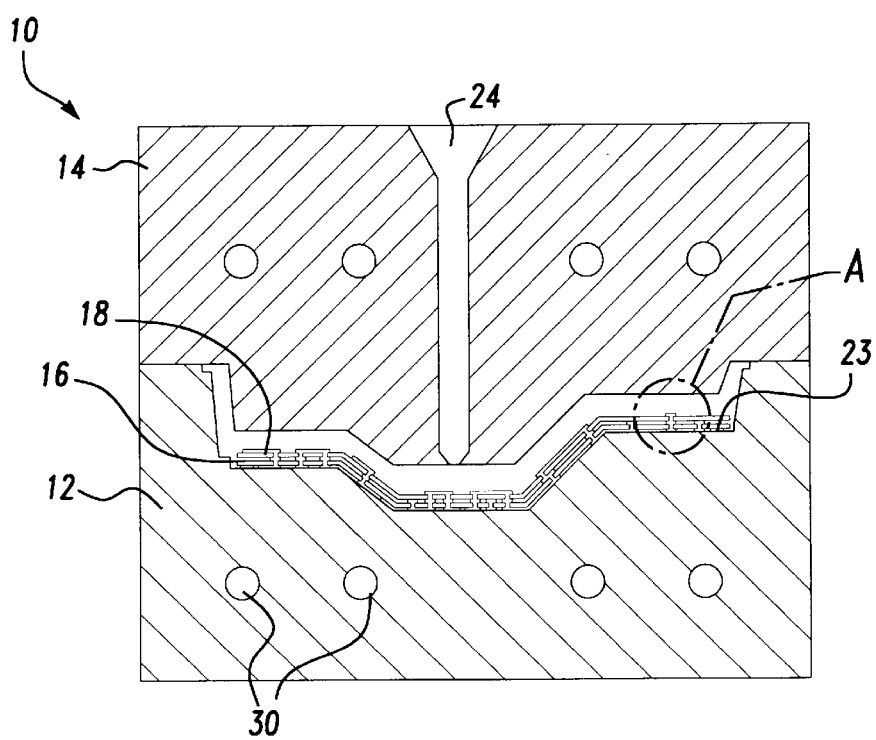
FIG. 2 is a cross-sectional view of the mold illustrated in FIG. 1, undergoing molding.
Figure 3:
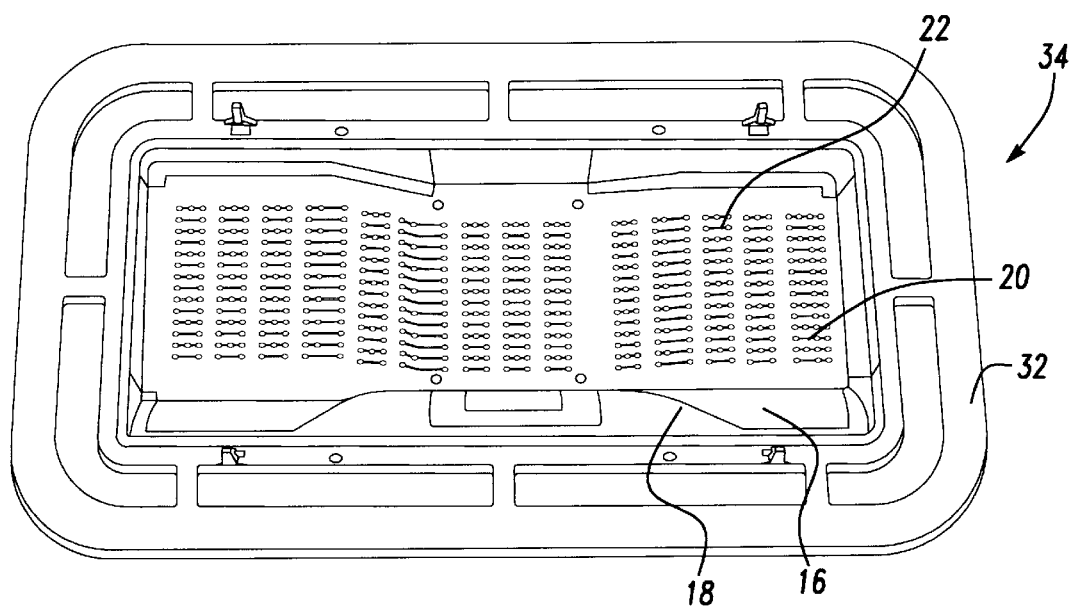
FIG. 3 is a plan view of a finished circuit assembly.

Illustrated in FIGS. 1–3 is a mold 10 used to manufacture a circuit assembly. Mold apparatus 10 comprises two or more movable molds 12, 14. The molds 12, 14 are conventional injection molding tools and are made from tool steel or other mold material. Placed within the open mold apparatus 10 are two or more layers of flexible film 16, 18. As will be described in more detail below, the flexible films 16, 18 include flexible circuits traces 20 attached thereon. The flexible circuits traces 20 have electrically conductive traces that are attached to the flexible films 16, 18 by a variety of methods including etching, plating, printing, or other technique. The electrical circuits traces 20 may be attached to one or both surfaces of each flexible film 16, 18. The flexible films 16, 18 include passages 22 that enable the flexible films 16, 18 to be electrically interconnected. These interconnect passages 22 may be filled or coated with either a conductive adhesive or an electrical solder as will be described in more detail below. In this case, the interconnect features or passages 22 are commonly referred to as plated through holes.

The flexible films 16, 18 may be two or more layers with plated interconnect passages 22 that interconnect the flexible films 16, 18. While the invention will be illustrated using two flexible films, three, four or more are also possible. Illustrated in FIG. 2 are films 16, 18 placed on the wall of the mold 12 opposite a resin sprue gate 24. This is an optimum location for in-molded films but other geometries and configurations are possible. In general, the interconnect passages 22 should not be placed over a gate location. A minimum keep-out space of 0.5 inches in diameter is needed to avoid the high shear heating from the plastic flow in this area of the mold. The flexible films 16, 18 may be attached to the mold 12 with capture pins, adhesive, gravity, thermoforming the film in the shape of mold 12, using die locking locations or other means. Films 16 and 18 are precisely aligned with respect to each other so that the interconnect passages align to electrically interconnect the films. Alignment pins 23 mate with alignment holes 25 on films 16, 18 to precisely align the films 16, 18 with respect to each other and with respect to the mold 12.

The dimension of the flexible films 16, 18 used to create circuit assemblies for automotive applications such as antilock brake modules ranged from 0.003 inches to 0.008 inches in thickness. Other thicknesses may also be used in the present invention.

Figure 2A:
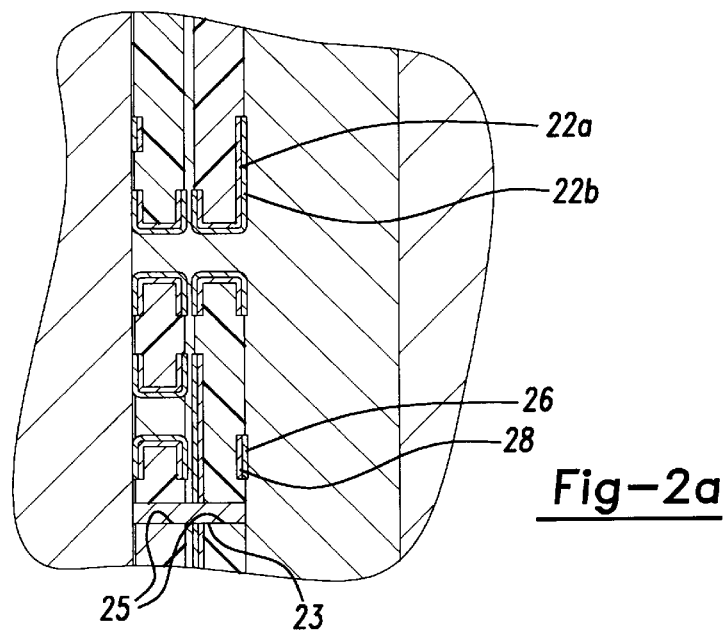
FIG. 2a is detail sectional view of the region marked "A" in FIG. 2.

FIG. 2a is an enlarged detailed view of the area marked "A" in FIG. 2. The interconnect passage 22a is directly overlaid passage 22b. The flexible circuits 20 on the flexible films 16, 18 are made from copper circuit traces 26. The copper traces not coated with solder mask are coated with a tin-lead solder 28. The thickness of the copper traces 26 on typical flexible circuits is either ½ oz or 1 oz copper for signal lines. Power lines require heavier traces either in thickness of width or both to carry the desired current rating. These heavy power lines may also be applied to the flexible films 16, 18 through plating or embossing. With the ability to create different weight copper traces, different layers of the multi-layer construction may be partitioned to handle power, signal or both. Other metallurgical platings or surface finishes on the traces may be used such as plated solder alloys, plated tin or gold, hot air solder leveled coatings (HASL) or anti-oxidant organic coatings. Solder mask or a polymeric overlay may be used to cover traces not used for mounting electronic components or interconnecting features. Alternatively, electrically conductive adhesives can be used in place of the solder to interconnect the films 16, 18.

Mold heaters 30 in molds 12, 14 heat the films 16, 18 to temperatures sufficient to cause the solder 28 to melt or reach a temperature within 20–40° C. of melting. The additional heat to melt the solder comes from the injected resin. When a conductive adhesive is used between the films 16, 18, the mold heaters 30 heat the films 16, 18 to a temperature sufficient to cause the adhesive to cure.

A thermoplastic resin 32 is injected into the closed mold apparatus 10. The molten plastic resin 32 flows adjacent to the films 16, 18 and causes the films 16, 18 to adhere to the molten plastic resin 32 and form a circuit assembly 34. The resin 32 flows into the passages 22a and 22b. The resin 32 in the passages 22a, 22b secures the films to each other and to the plastic material by a mechanical attachment. When the material of film 18 is made from the same or compatible material as resin 32, then the molten resin heats and softens the film 18 sufficiently to fuse thereto. If the heat and pressure from the resin 32 is sufficient, then the adjacent film layer 16 also heats, softens and fuses to the film 18. The heat and pressure from the molten resin 32 is sufficient to melt the solder 28 or to cure a conductive adhesive with or without the need of the mold heaters 30. The resulting circuit assembly 34 forms an integrally molded three-dimensional article having multiple interconnected electric circuit layers. After the plastic resin 32 has cooled sufficiently to retain a shape, the mold 10 is opened and the final circuit assembly 34 is removed. The process taught in the present invention may interconnect plated electrical interconnect passages and electrical interconnect features placed adjacent to each other. If the film and resin do not fuse together, then an adhesive may be used to bond the polymers.

Oxidation may affect the soldering process so flux may be applied to the solder coatings prior to reflow to insure a highly reliable solder interconnection. The solder 28 added to the films 16, 18 may be reflowed in subsequent post molding assembly steps where flux may be applied to remove the oxides.

If a solder coating or conductive interconnection adhesive is not used on the films during the molding process, the electrical interconnection of the different films may be completed during the subsequent post molding assembly of the backing structure. After molding, solder paste will be dispensed on the surface circuitry where electronic components will be placed and solder paste will be dispensed into the interconnect passages. The solder paste is then reflowed to create metallurgical interconnections between the components and the multiple circuit layers. The same process may be used for conductive adhesives.

Illustrated in FIG. 3 is an in-molded, multi-layer circuit assembly 34 manufactured using the method so far described. The part contains two PET (polyethylene terepthalate) double sided films. Both sides of each film contain electrical circuits. The flexible circuits traces 20 are aligned and interconnected through plated interconnect passages 22. The plastic resin 32 used to form the backing structure is also made from PET and fuses to film 18 and causes the films 16, 18 to fuse together into one integral circuit assembly 34.

Figure 4:
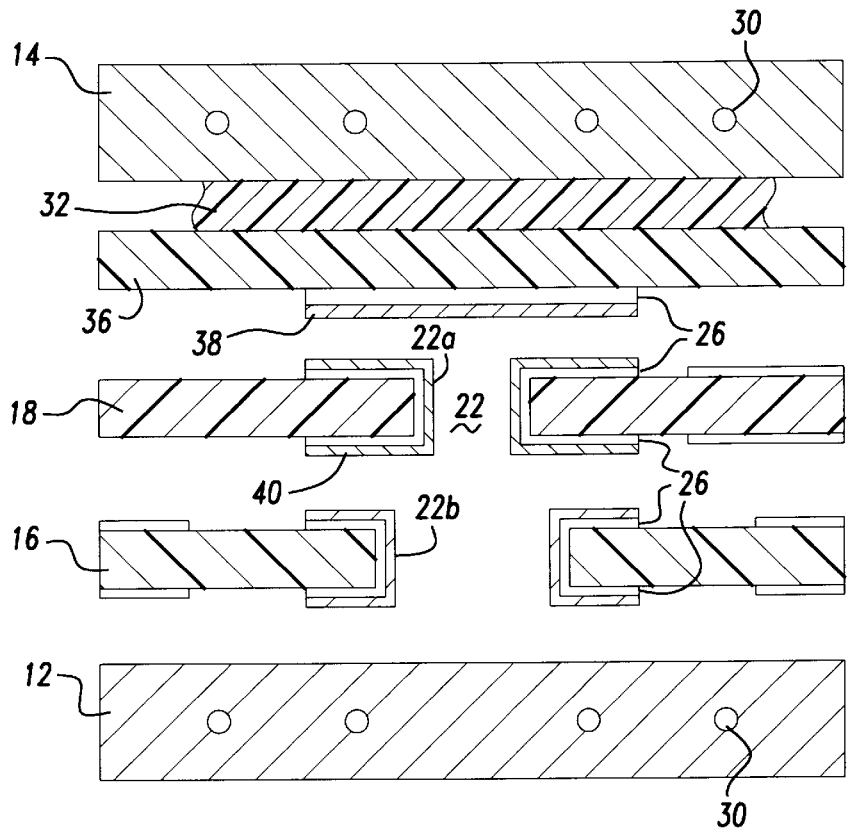
FIG. 4 is a cross-sectional view of a first alternative embodiment of the present invention using a barrier film.

FIGS. 4–9 show alternative embodiments of the present invention using a barrier layer to prevent the molten plastic resin from filling the electrical interconnect passages. The embodiment illustrated in FIG. 4 shows a three-layer film stack. Film layers 16, 18 contain copper traces 26 used to interconnect electronic components. Barrier layer 36 is placed between the flexible film layer 18 and the mold 14. The barrier film 36 may again be made from a compatible or dissimilar material as resin 32 and film layers 16, 18. A metal pad 38 may be added to the barrier layer 36 and positioned over the passage 22a when the barrier layer 36 is made from a material that would soften during the injection molding step. The pad 38 covers the opening in passage 22a and prevents molten plastic material 32 from entering the passage 22.

The passage 22a may be made with a shoulder area 40. The shoulder area 40 has a diameter greater than the diameter of passage 22b. This prevents the shoulder area 40 from entering within the passage 22a. The shoulder area 40 will prevent the pad 38 from deforming into the interconnection passage between the two film layers and allow for intimate contact to occur between the circuitry on copper traces 26.

The copper traces 26 may be coated with a solder layer 28 to electrically connect the film layers 16, 18 and the barrier layer 36 during or after the molding process. The molds 12, 14 have heaters 30 to heat the solder 28 as described above.

Figure 5:
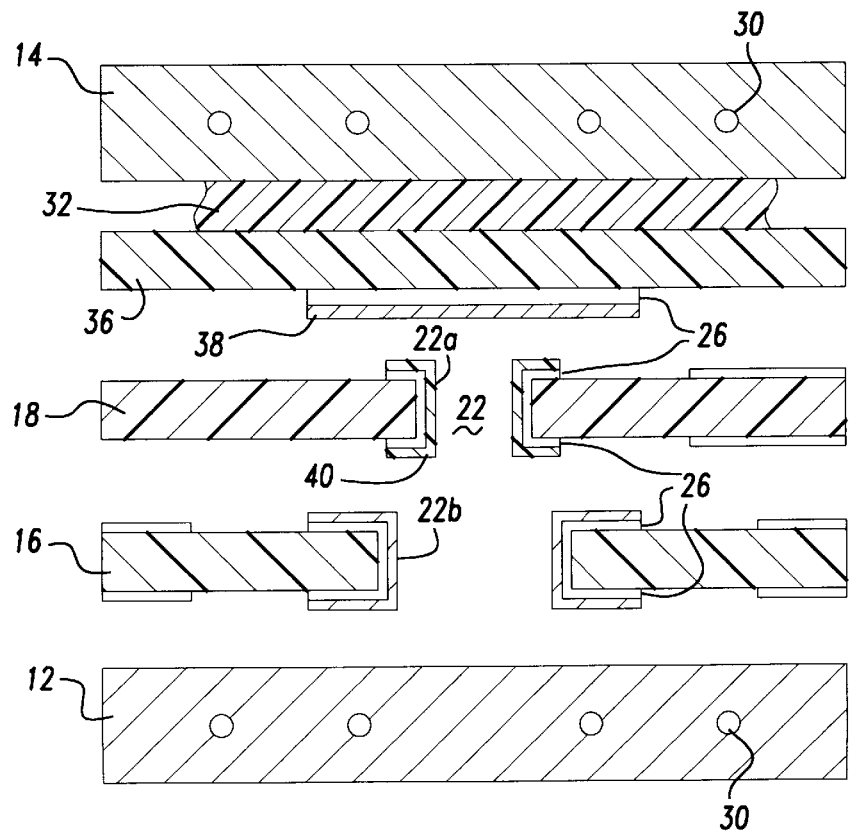
FIG. 5 is a cross-sectional view of a second alternative embodiment of the present invention using concentric electrical passages.

In the embodiment shown in FIG. 5, the shoulder area 40 has a diameter smaller than the diameter of passage 22b. Making the diameter of shoulder area 40 smaller than the diameter of passage 22b allows a portion of the shoulder area 40 to fit within the passage 22b. This has the advantage of allowing the pad to fit into the passage and helping the alignment between the layers.

Figure 6:
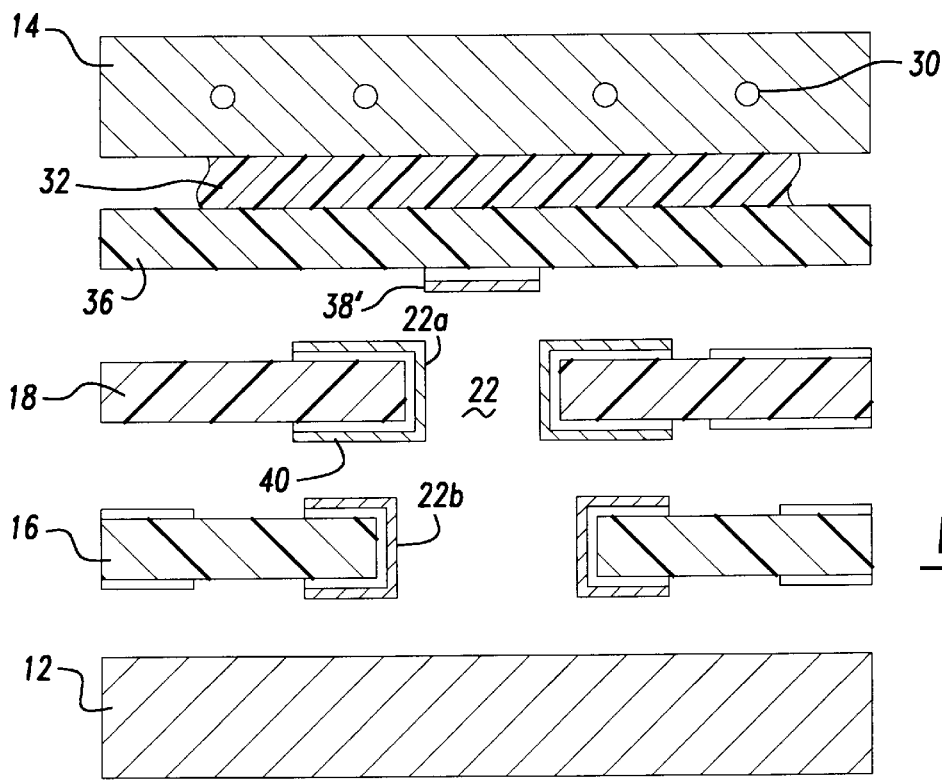
FIG. 6 is a cross-sectional view of a third alternative embodiment of the present invention using an end plug on a barrier film.

The embodiment illustrated in FIG. 6 shows a pad 38' having a diameter that is smaller than the diameter of the passage 22a. Making the diameter of the pad 38' smaller than the diameter of passage 22a allows a portion of the pad 38' to fit within the passage 22a. This also allows the pad to fit into the passage and to align the layers.

Figure 7:
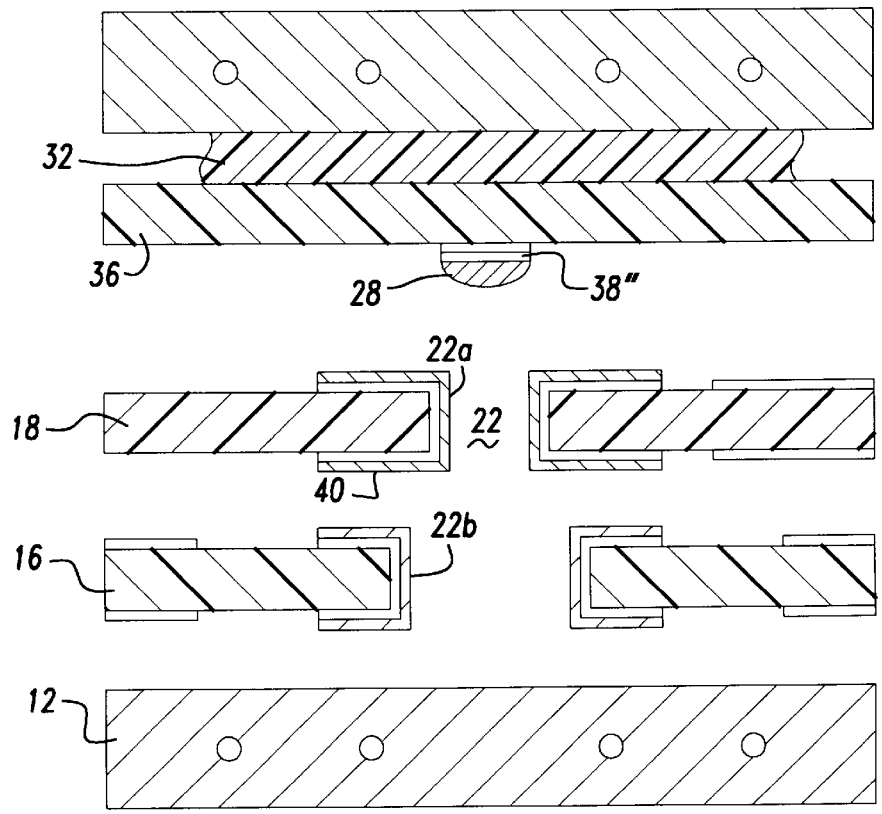
FIG. 7 is a cross-sectional view of a fourth alternative embodiment of the present invention using a solder end plug on a barrier film.

The embodiment illustrated in FIG. 7 shows a pad 38" also having a diameter that is smaller than the diameter of the passage 22a. The pad 38" includes a large amount of solder 28 that forms a drop or deposit. The deposit of solder on pad 38" fits within the passage 22a. This has the advantage of melting during the molding process and filling the passage 22 thus creating an electrical interconnection between all layers.

Figure 8:
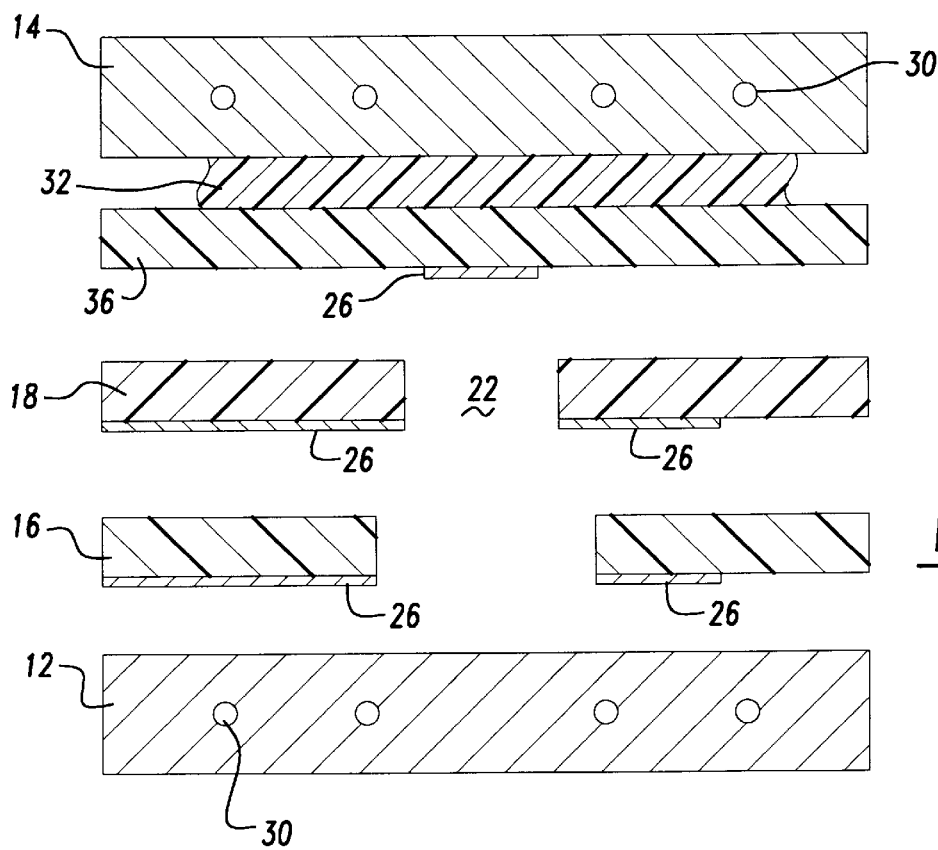
FIG. 8 is a cross-sectional view of a fifth alternative embodiment of the present invention.

The embodiment illustrated in FIG. 8 shows film layers 16, 18 that are not electrically interconnected until after passage 22 is filled with solder. The traces 26 are all on different layers and are not electrically interconnected by the molding operation. After the circuit assembly is molded, passage 22 is filled with solder and electrically interconnects the different layers.

Figure 9:
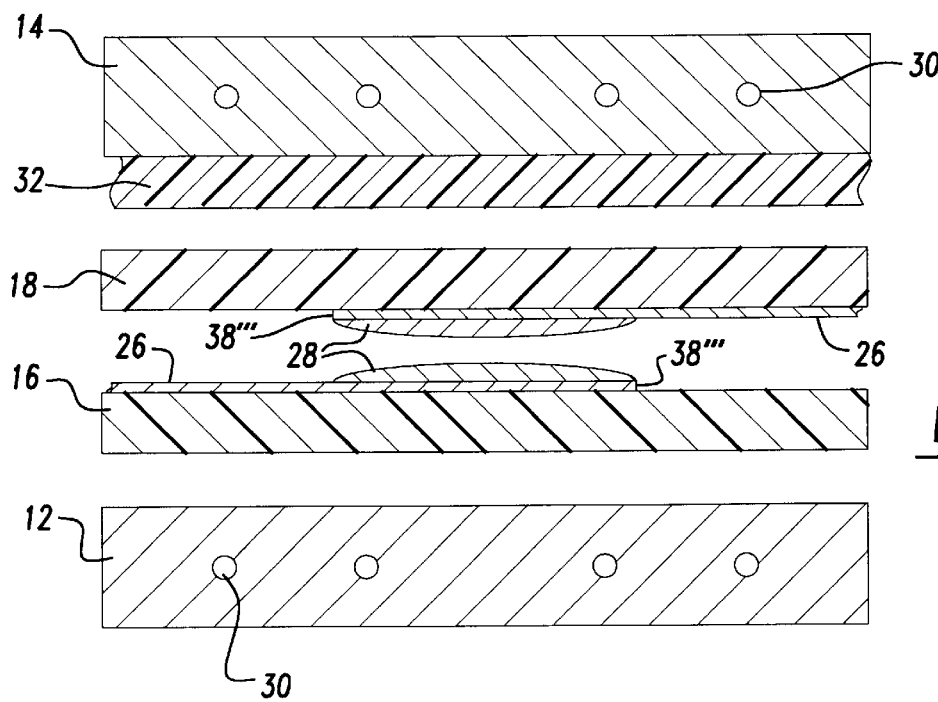
FIG. 9 is a cross-sectional view of a sixth alternative embodiment of the present invention.

The embodiment illustrated in FIG. 9 shows film layers 16, 18 having facing traces 26. The facing traces 26 are electrically interconnected by a deposit of solder 28 on pad 38". Any combination of facing, alternating or interconnecting film layers may be used in the present invention.

While not illustrated, any combination of shoulder diameter and pad diameter may be use both with and without the deposit of solder to obtain the desired properties of the finished circuit assembly. While each of the embodiments shown in FIGS. 4–7 and 9 include a solder layer 28, a conductive adhesive may be used in place of the solder layer 28 or alternatively, no coating may be applied to the copper traces 26 as shown in Fiure 8. When no solder or adhesive is used prior to molding the circuit assembly 34, it is possible to fill the interconnect passages 22 with solder or adhesive when the electronic components (not shown) are secured to the circuit assembly. Interconnect features (not shown) from the electronic components may be inserted within the interconnect passages 22 and the assembly heated. The heating operation is sufficient to reflow the solder 28 or cure the adhesive simultaneously securing the electronic component to the circuit assembly 34 and electrically interconnecting the films 16, 18.

In some applications solder interconnections are not required. It may be possible to eliminate the use of solders or adhesives between the film layers 16, 18 by applying sufficient pressured during the injection molding step to "coin" or cold weld the electrical passages from two different layers together.

In the above example, the part and films were both made of PET but other plastic materials such as polyetherimide and nylon may be used in the same fashion. These materials fuse together at or above their melting point to create a single homogeneous two or three-dimensional part or backing structure. The heat for this fusion of materials is supplied by the mold heaters 30 and the injected resin temperature. These settings vary from material to material therefore, each in-molded construction requires its own unique set of processing parameters. For these materials, adhesive between the flexible film layers 16, 18 and the barrier layer 36 are not required to bond the films together.

The process can also use dissimilar resins and films by using an adhesive interposing layer. In this way, difficult to bond materials may be used such as polyimide flexible circuits 16, 18 and PET for the plastic resin 32. The barrier layer 36 may also be used as an additional circuit layer.

In yet another alternative embodiment of the present invention, it is possible to use circuitized flexible films and resins that are generally incompatible with one another to provide connecting tabs. The connecting tabs may be peeled from the backing structure or from different flexible film layers to expose electrical connectors and to aid in connecting the circuit assembly to power and signal sources.

Figure 10:
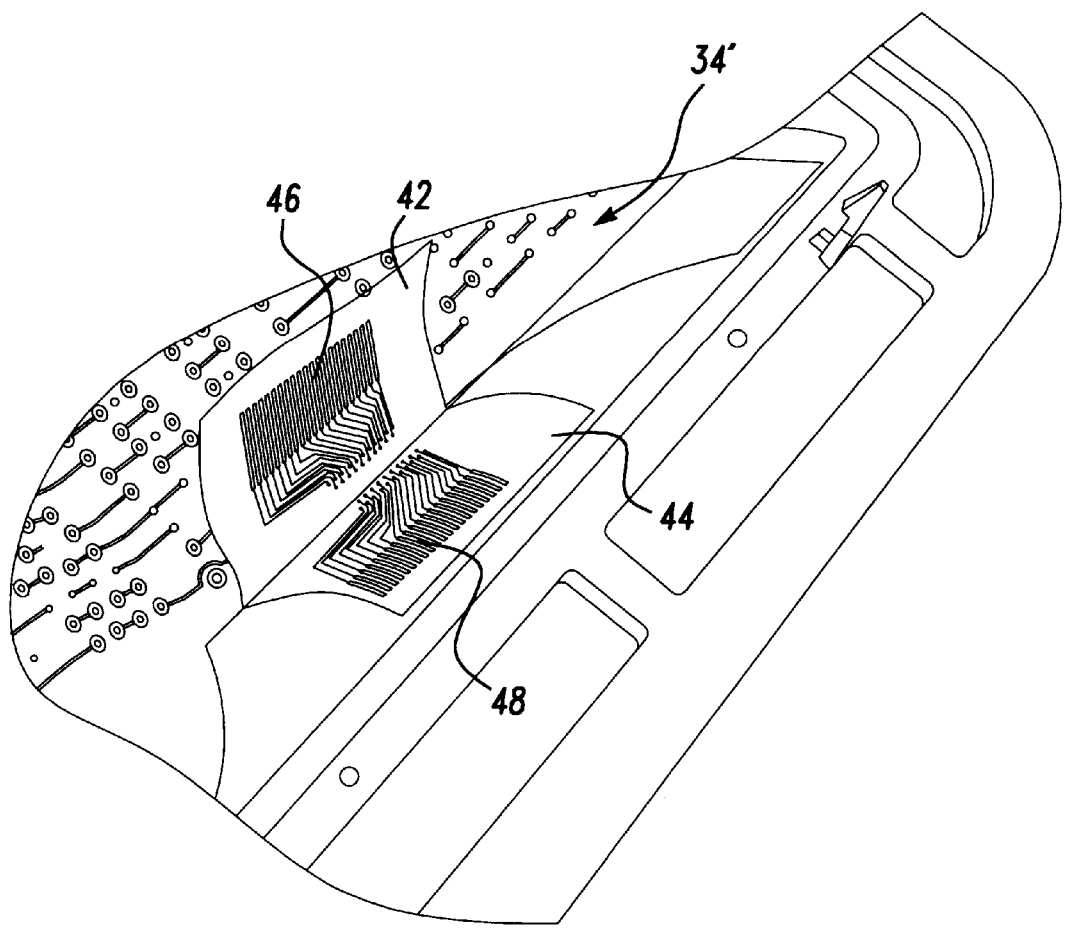
FIG. 10 is a perspective view of a seventh alternative embodiment of the present invention using connection tabs.

Illustrated in FIG. 10 is a circuit assembly 34' having tabs 42, 44. The tabs 42, 44 are regions of films 16, 18 that include electrical connectors 46, 48. The electrical connectors 46, 48 act to connect the circuit assembly to other devices and to receive electrical power and signals. When using circuitized flexible films 16, 18 made from dissimilar materials, the tabs 42, 44 may be pulled apart to expose the electrical connectors 46, 48. When the films 16, 18 are made from the same or compatible materials, a release film of Teflon™ or other non-stick material is placed between the tabs 42, 44 to keep them from fusing during the molding step.

In the same way, the circuitized flexible film 18 may be made from a dissimilar material from resin 32 to allow tab 44 to be pulled away from the backing structure and expose connectors on the reverse side (not show). Alternatively, a release film applied to the reverse side of tab 44 allows the use of compatible materials for the flexible film 18 and resin 32 while still allowing the connecting tab 44 to be pulled away from the backing structure.

The present invention allows for two or more flexible films having circuits to be interconnected in a mold while simultaneously molding a backing structure. The circuit assembly is integrally formed around the flexible circuits to attach the flexible films to each other and to the backing structure. Electrical passages between flexible films may be used to interconnect the flexible films and also provide an attachment location for electronic components. Solder or adhesive material may be placed in the electrical passages to improve the electrical connectivity or to provide solder or adhesive material for follow-on processing. A barrier layer may optionally be used to keep these electrical passages free from molten resin from the molding operation. Connection tabs may be formed on the flexible films to provide an easy and reliable location to attach the circuit assembly to other devices or power sources.

The present invention, therefore, is well adapted to fulfill the objects, features and advantages outlined above as well as others that are inherent therein. While the invention is been illustrated by its preferred embodiments, other embodiments of the present invention are also possible and are intended to be covered within the spirit and scope of the attached claims.

What is claimed:

1. A method of manufacturing a circuit assembly from two or more layers of flexible film comprising the following steps:

forming a first flexible film having conductive traces on at least one surface thereof, said first flexible film having a first interconnect through passage that provides an electrical connection through said first flexible film;

forming a second flexible film having conductive traces on at least one surface thereof, said second flexible film having a second interconnect through passage through said second flexible film;

overlying said first flexible film juxtaposed said second flexible film so that said first and second through passages are aligned and electrically connect said first and second films;

providing a laminate barrier film;

positioning said barrier film adjacent said aligned first and second through passages;

placing said first and second flexible films and said barrier film within an open mold;

closing said mold;

injecting a plastic material within said mold adjacent at least one surface of said first and second flexible films and causing said first and second flexible films to adhere to said plastic material to form said circuit assembly whereby said injected plastic material is prevented from entering said first and second through passages by said barrier film;

cooling said plastic material; and removing said circuit assembly from said mold.

2. The method of claim 1, further comprising the step of applying a solder between said first and second passages and soldering said first and second passages after said injecting step.

3. The method of claim 1, further comprising the step of applying an electrically conductive adhesive between said first and second passages and adhering said first and second interconnect passages after said injecting step.

4. The method of claim 1, further comprising heating said mold.

5. The method of claim 1, further comprising proving a resin passage through said first and second films and said injecting step injects plastic material through said resin passage, said resin in said resin passage secures said first and second film to said circuit assembly.

6. The method of claim 1, wherein said barrier film includes an electrically conductive pad positioned over said aligned first and second through passages.

7. The method of claim 6, further comprising placing a quantity of solder material on said conductive pad and positioning said solder within said first passage.

8. The method of claim 6, further comprising placing a quantity of conducive adhesive material on said conductive pad and positioning said adhesive within said first passage.

9. The method of claim 1, further forming tabs on said first and second flexible films and aligned said tabs juxtaposed one another and applying electrical connectors to the tabs.

10. The method of claim 9, further comprising placing a releasable material between said tabs and separating said tabs after said molding operation.

11. The method of claim 1, wherein said first flexible film and said plastic material are made from compatible materials.

12. The method of claim 1, wherein said first flexible film and said plastic material are made from dissimilar materials, further comprising the step of placing an adhesive interposing layer between said first flexible film and said plastic material and bonding said first flexible film to said plastic material.

13. A method of manufacturing a circuit assembly from two or more layers of flexible film comprising the following steps:

forming a first flexible film having electrical wiring circuits on at least one surface thereof, said first flexible film having an interconnect passage that provides an electrical connection through said flexible film;

forming a second flexible film having electrical wiring circuits on at least one surface thereof, said second flexible film having an electrical interconnect feature that connects with said passage on said first film and electrically connects said first film with said second film;

overlying said first flexible film juxtaposed said second flexible film so that said passage is aligned adjacent said interconnect feature;

providing a laminate barrier film having an electrically conductive pad;

positioning said electrically conductive pad of said barrier film adjacent said passage whereby said injected resin is prevented from entering said passage;

applying a solder to said passage, said electrically interconnect feature and said conductive pad;

forming tabs on said first and second flexible films and aligning said tabs juxtaposed one another and applying electrical connectors to the tabs;

placing said first and second flexible films and said barrier film within an open mold;

closing said mold;

injecting a plastic material within said mold adjacent at least one surface of said first and second flexible films and causing said first and second flexible films to adhere to said plastic material;

heating said mold and soldering said interconnect feature, passage and pad to form said circuit assembly;

cooling said plastic material; and removing said circuit assembly from said mold.

14. The method of claim 13, further comprising placing a releasable material between said tabs and separating said tabs after said molding operation.

* * * * *